(12) United States Patent
Zhang

(10) Patent No.: US 7,950,446 B2
(45) Date of Patent: May 31, 2011

(54) HEAT DISSIPATION DEVICE WITH CLIP FOR MOUNTING A FAN TO A HEAT SINK THEREOF

(75) Inventor: Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 934 days.

(21) Appl. No.: 11/778,548

(22) Filed: Jul. 16, 2007

(65) Prior Publication Data
US 2009/0020262 A1 Jan. 22, 2009

(51) Int. Cl.
*H05K 7/20* (2006.01)
(52) U.S. Cl. .................................. 165/80.3; 165/121
(58) Field of Classification Search .......... 165/80.2, 165/80.3, 185, 121; 361/697
See application file for complete search history.

(56) References Cited

U.S. PATENT DOCUMENTS

| 6,396,697 | B1 | 5/2002 | Chen | |
|---|---|---|---|---|
| 2001/0030037 | A1* | 10/2001 | Hellbruck et al. | 165/80.3 |
| 2003/0024688 | A1* | 2/2003 | Dowdy et al. | 165/80.3 |
| 2005/0072555 | A1* | 4/2005 | Sheng-Hsiung | 165/80.3 |
| 2005/0082034 | A1* | 4/2005 | Hwang et al. | 165/80.3 |

FOREIGN PATENT DOCUMENTS

TW 538229 6/2003
TW M248226 10/2004

* cited by examiner

*Primary Examiner* — Teresa J Walberg
(74) *Attorney, Agent, or Firm* — Jeffrey T. Knapp

(57) ABSTRACT

A clip is capable of engaging with a heat sink for securing a fan to the heat sink. The clip includes a mounting plate, a supporting plate, a spring fastener and a spring positioning plate. The supporting plate extends from the mounting plate. The spring fastener extends from the supporting plate and spaced from the mounting plate for pressing the fan toward the heat sink. The spring positioning plate extends from the mounting plate. The mounting plate is horizontally inserted into the heat sink and the spring positioning plate is V-shaped and resiliently engaged in a V-shaped receiving space of the heat sink, thereby securing the clip to the heat sink.

9 Claims, 4 Drawing Sheets

HEAT DISSIPATION DEVICE WITH CLIP FOR MOUNTING A FAN TO A HEAT SINK THEREOF

BACKGROUND OF THE INVENTION

1. Field of the Invention

The present invention relates generally to a heat dissipation device, and more particularly to a heat dissipation device having a clip, which has simple structure for securely attaching a fan to a heat sink of the heat dissipation device.

2. Description of Related Art

It is well known that during operation computer electronic devices such as central processing units (CPUs) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is desired to direct airflow onto the heat sink. Usually, the fan is mounted to the heat sink using a fan holder attached to the heat sink. Conventionally, the heat sink mainly comprises a base contacting with a heat generating electronic device and a plurality of fins extending from the base. A plurality of screw threads is formed in two outermost fins at opposite sides of the heat sink. The fan holder defines a plurality of fixing apertures corresponding to the screw threads of the heat sink. Pluralities of screws are engaged in the fixing apertures of the fan holder and the screw threads of the heat sink, thereby fastening the fan holder to the heat sink. The structure can mount the fan onto the heat sink; however, complexities arise when installing the fan holder onto the heat sink using multiple screws.

What is needed, therefore, is a heat dissipation device which has a fan and a heat sink wherein the fan can be easily mounted to the heat sink via a clip.

SUMMARY OF THE INVENTION

A clip in accordance with a preferred embodiment of the present invention is capable of engaging with a heat sink for securing a fan to the heat sink. The heat sink has a base and a plurality of fins extending upwardly from the base. The clip includes a mounting plate, a supporting plate, a spring fastener and a spring positioning plate. The supporting plate extends from the mounting plate. The spring fastener extends from the supporting plate and is spaced from the mounting plate. The spring positioning plate extends from the mounting plate. The spring positioning plate is deformable to be engagingly fitted in a V-shaped receiving space defined in a top of an edge of a corresponding fin when the mounting plate is horizontally inserted into a receiving space of the corresponding fin defined behind and in communication with the V-shaped receiving space. Thus, the clip is secured to the top of the heat sink. The spring fastener can be deformed to elastically engage with a bottom edge of a fan thereby mounting the fan on the top of the heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
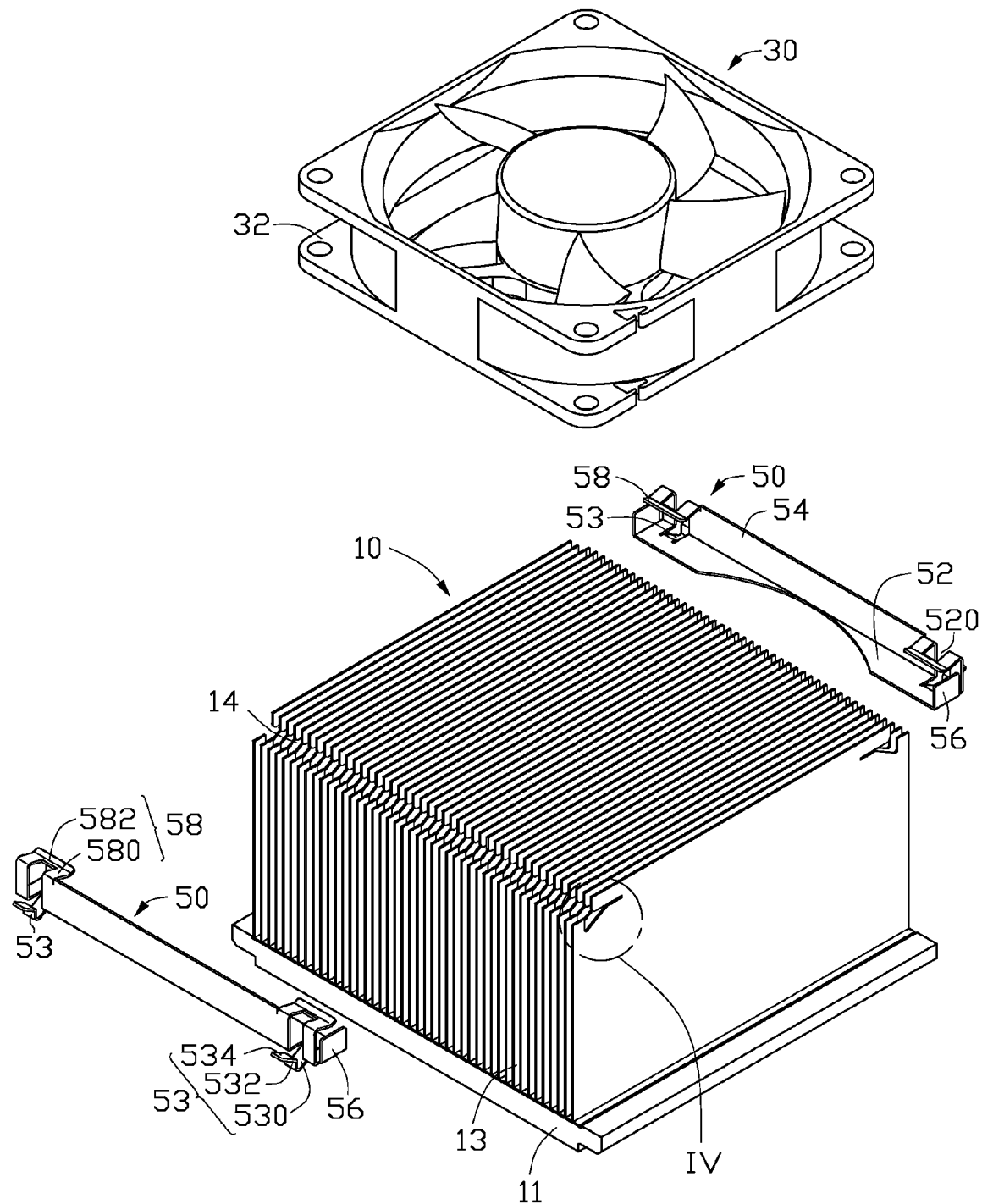
FIG. 1 is an exploded, isometric view of a heat dissipation device in accordance with a preferred embodiment of the present invention.
Figure 2:
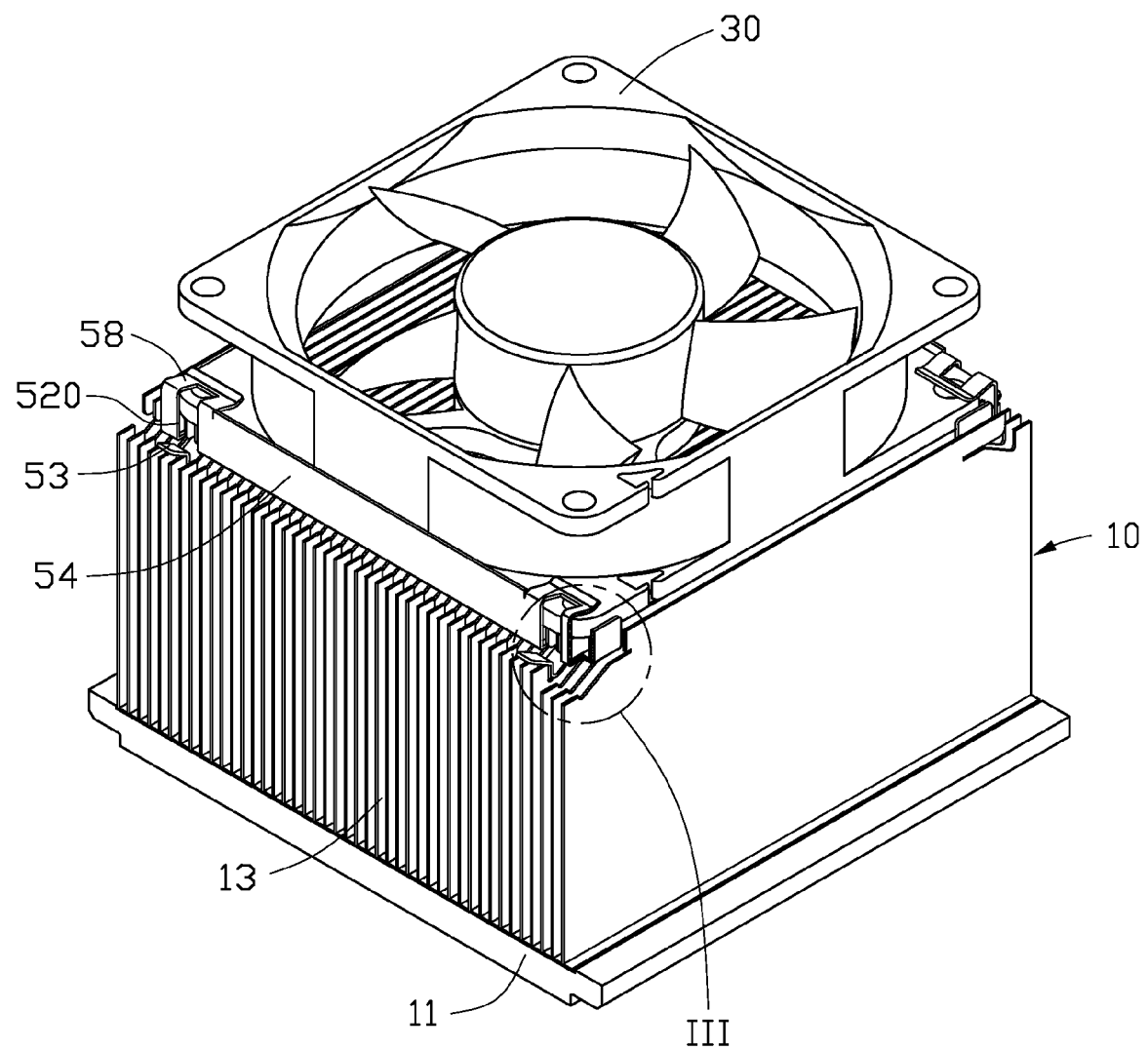
FIG. 2 is an assembled view of FIG. 1.
Figure 3:
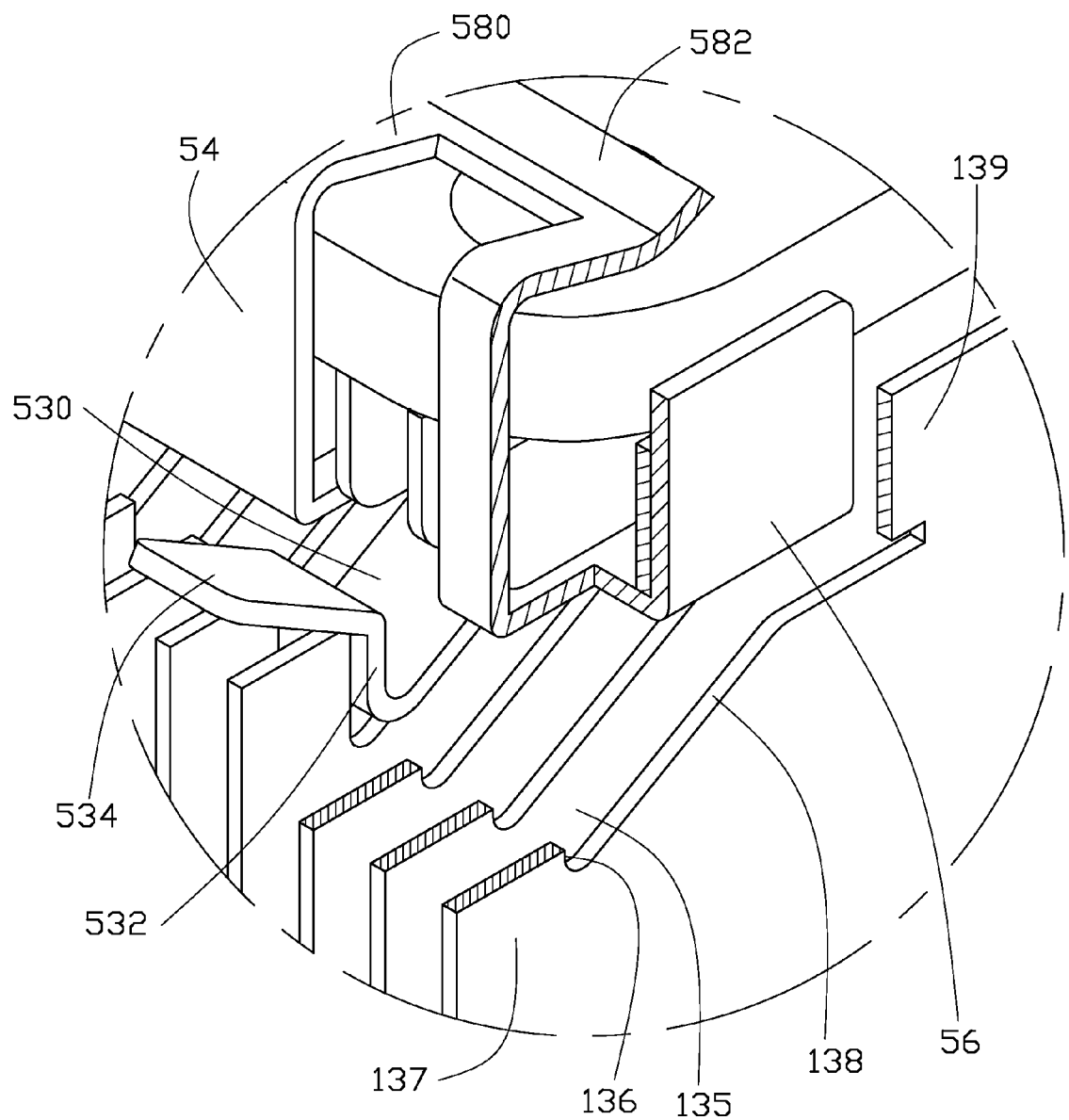
FIG. 3 is an enlarged view of circle III of FIG. 2.
Figure 4:
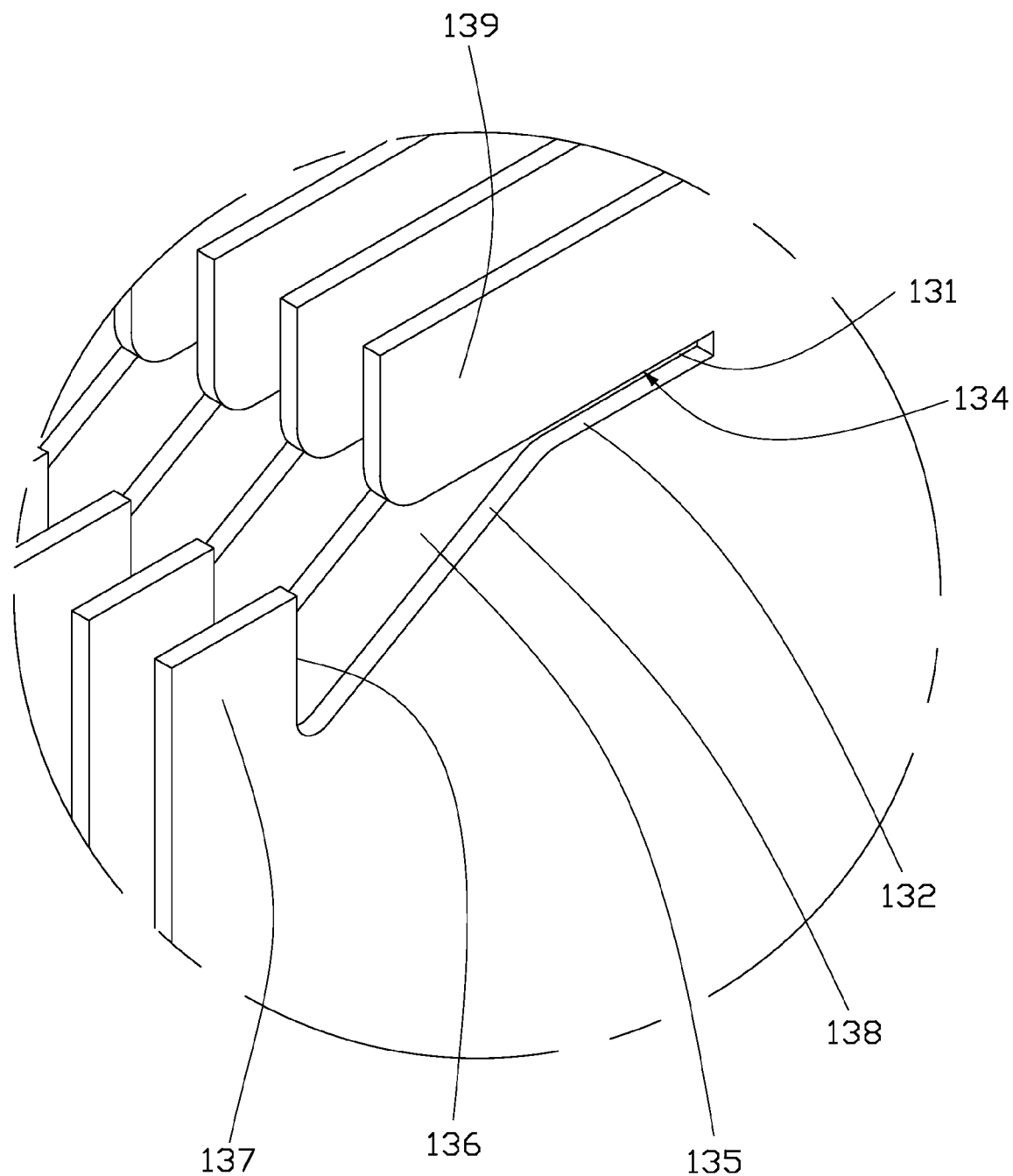
FIG. 4 is an enlarged view of circle IV of FIG. 1.

Referring to FIGS. 1-4, a heat dissipation device in accordance with a preferred embodiment of the present invention is illustrated. The heat dissipation device comprises a heat sink 10, a fan 30, and a pair of clips 50 located on opposite sides of the heat sink 10 for securing the fan 30 on the heat sink 10.

The heat sink 10 generally comprises a base 11 and a plurality of fins 13 mounted on the base 11. The base 11 has a bottom face for contacting with a heat-generating electronic component (not shown). The fins 13 are arranged in parallel on a top surface of the base 11. Each fin 13 has two cutouts (not labeled), which are defined in top portions at opposite sides of the fin 13, respectively. Each cutout includes a first receiving space 131 and a second receiving space 135 communicating with the first receiving space 131.

The first receiving space 131 is a slit, which extends along and parallel to an upper surface of the fin 13. A cantilever 139 is formed at the top portion of the fin 13 and adjacent to the first receiving space 131. A lower surface of the cantilever 139 forms an upper surface 134 of the first receiving space 131. A lower surface 132 of the first receiving space 131 is parallel to and shorter than the upper surface 134. When the fins 13 are arranged one by one on the base 11, the first receiving spaces 131 of each fin 13 is aligned with its corresponding first receiving space 131 of its adjacent fin 13. As a result, two parallel grooves 14 are formed by the first receiving spaces 131 in opposite sides of the heat sink 10, extending along a first direction, which is perpendicular to the fins 13.

When viewed from the first direction, the second receiving space 135 is a V-shaped slit, and includes an outer surface 136 and a bevel surface 138 connected to the outer surface 136. A cantilever 137 is formed at an edge of the fin 13 and adjacent to the second receiving space 135. An inner surface of the cantilever 137 serves as an outer surface 136 of the second receiving space 135. An upper surface of the cantilever 137 is parallel to and coplanar with the lower surface 132 of the first receiving space 131. The bevel surface 138 connects a lower part of the outer surface 136 with the lower surface 132 of the first receiving space 131. Thus, the first receiving space 131 communicates with the second receiving space 135.

Furthermore, the cantilever 139 extends towards and not to the outer surface 136 of the second receiving space 135, and a distance or a space is left therebetween. The clip 50 slides into the cutouts (not labeled) through the space between the cantilever 139 and the outer surface 136, and is held in the cutouts via engagements between the clips 50 and the cutouts.

The two clips 50 are mounted on the top portions at two opposite sides of the heat sink 10. Each clip 50 includes a mounting plate 52, a supporting plate 54, two spaced spring positioning plates 53 and two spaced spring fasteners 58. In this embodiment, the clip 50 further comprises two spaced stoppers 56, which abut against two corresponding cantilevers 139 of the heat sink 10 to position and hold the clip 50 on the heat sink 10.

The mounting plate 52 is a plate structure, and horizontally inserted in the groove 14 formed by the first receiving spaces 131 of the heat sink 10 at a corresponding lateral side of the heat sink 10. The mounting plate 52 has an arc-shaped edge in a central area thereof. The arc-shaped edges of the mounting plates 52 are oriented towards each other, and a round opening (not labeled) is defined therebetween after the mounted plates 52 are horizontally installed into the grooves 14 formed by the first receiving spaces 131. The round opening is for guiding airflow produced by the fan 30 to pass therethrough to cool the fins 13 of the heat sink 10.

The supporting plate 54 is a vertical plate, and extends upwardly from a long side of the mounting plate 52. The stoppers 56 extend upwardly from opposite edges at short sides of the mounting plate 52. After the mounting plate 52 has been installed into the groove 14 formed by the first receiving spaces 131, the stoppers 56 abut against fins 13 of the heat sink 10 to prevent the clips 50 from moving relative to the heat sink 10 along the first direction. At the same time, the mounting plate 52 engages in the groove 14 to prevent the clip 50 from moving relative to the heat sink 10 along a second direction, which is perpendicular to the base 11 and the first direction. Meanwhile, the spring positioning plates 53 engage in the second receiving space 135 to prevent the clips 50 from moving relative to the heat sink 10 along a third direction, which is perpendicular to the first and second direction. In other words, the spring positioning plate 53 serves to prevent the mounting plate 52 of the clip 50 from moving out of the first receiving space 131. The detailed structure of the spring positioning plate 53 will be described in the following text.

The spring positioning plates 53 extend from two ends of the long side of the mounting plate 52. In this embodiment, the spring positioning plates 53 are formed by stamping the mounting plate 52 and the supporting plate 54 so that two spaced slits 520 are formed in the mounting plate 52 and the supporting plate 54 corresponding to the spring positioning plates 53, respectively. Each spring positioning plate 53 includes a connecting portion 530, an impact portion 532 and a handle 534.

The connecting portion 530 extends downwardly and outwardly from the mounting plate 52 at a place facing to the slit 520. The impact portion 532 extends upwardly and outwardly from an end of the connecting portion 530 in such a manner that the impact portion 532 and the connecting portion 530 together form a V-shaped configuration. The handle 534 extends outwardly from an end of the impact portion 532 for facilitating operation of the spring positioning plate 53. When the mounting plate 52 is inserted into the groove 14, the impact portion 532 and the connecting portion 530 are deformed and squeezedly retained in the second receiving space 135. As a result, a resistant force is applied on the cantilever 137 to prevent the mounting plates 52 of the clip 50 from moving out of the first receiving spaces 131 along the third direction. In addition, since the impact portion 532 abuts tightly against the outer surface 136 of the second receiving space 135, a friction exists therebetween, and also prevents the clips 50 from moving along the first direction. Therefore, the clips 50 are firmly mounted on the top portions of the heat sink 10; meanwhile, the spring fasteners 58 of the clip 50 are located above the heat sink 10 for readily securing the fan 30 on the heat sink 10.

The spring fasteners 58 are located at opposite sides of the supporting plate 54, and extend from a top edge of the supporting plate 54 in the same direction as the mounting plate 52. Each spring fastener 58 includes a connecting portion 580 extending from the top edge of the supporting plate 54, and a pressing portion 582 extending upwardly from an end of the connecting portion 580. The pressing portion 582 is deformable to press a bottom flange 32 of the fan 30 so that the fan 30 is secured on the heat sink 10 via the clips 50.

When disassembling the clip 50 from the heat sink 10, the handle 534 is operated to cause the spring positioning plate 53 to be further squeezed. The impact portion 532 is driven to move away from the cantilever 137 towards the connecting portion 530. As a result, the mounting plate 52 is easily removed from the first receiving spaces 131 along the third direction and in this way the clip 50 is disassembled from the heat sink 10.

As described above, the spring positioning plate 53 extends outwards from the mounting plate 52. However, the spring positioning plate 53 may be designed to extend from the supporting plate 54, even the spring fasteners 58, as long as it is capable of cooperating with the fins 13 to mount the clip 50 to the heat sink 10.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat dissipation device comprising:
   a heat sink comprising a plurality of fins, at least one of the fins comprising:
   two slits respectively defined in opposite sides thereof to form two first receiving spaces; and
   two V-shaped slits defined in the opposite sides thereof to form two second receiving spaces;
   a fan; and
   two clips each engaging with both the heat sink and the fan to secure the fan on the heat sink, each clip comprising:
   a mounting plate inserted in one corresponding first receiving space;
   a supporting plate extending from the mounting plate;
   a spring fastener connected to the supporting plate and spaced from the mounting plate; and
   a spring positioning plate extending from one of the mounting plate, the spring fastener and the supporting plate, the spring positioning plate received in one corresponding second receiving space to restrict the mounting plate in the corresponding first receiving space to secure the each clip to the heat sink;
   wherein after the clips are mounted on the heat sink, the spring fasteners press the fan toward the mounting plates to secure the fan on the heat sink.

2. The heat dissipation device of claim 1, wherein on each side of the at least one fin, the first receiving space communicates with the corresponding second receiving space.

3. The heat dissipation device of claim 1, wherein the first receiving spaces are opened to opposite directions.

4. The heat dissipation device of claim 3, wherein the first receiving spaces and the second receiving spaces are defined in each of the fins of the heat sink, the first receiving spaces located at a corresponding side of the heat sink are aligned with each other to define a first groove in the corresponding side of the heat sink, and the second receiving spaces located at a corresponding side of the heat sink are aligned with each other to define a second groove in the corresponding side of the heat sink.

5. The heat dissipation device of claim 4, wherein the first receiving space and the second receiving space of each of the at least two fins and located at the corresponding side of the heat sink communicate with each other.

6. The heat dissipation device of claim 1, wherein the spring positioning plate extends from the mounting plate, and includes a connecting portion extending from the mounting plate, and an impact portion extending from an end of the connecting portion in such a manner that the connecting portion and the impact portion together form a V-shaped configuration, which is held in said one corresponding second receiving space.

7. The heat dissipation device of claim 6, wherein the spring positioning plate further comprises a handle extending from an end of the impact portion for facilitating operation of the spring positioning plate.

8. The heat dissipation device of claim 7, wherein the each clip further comprises two spaced stoppers, which abut against the heat sink and locate and restrict the each clip on the heat sink.

9. The heat dissipation device of claim 1, wherein the spring fastener includes a connection portion extending outwardly from a top edge of the supporting plate and a pressing portion extending upwardly from an end of the connection portion and pressing the fan towards the mounting plate.

* * * * *